(12) United States Patent
Shin et al.

(10) Patent No.: US 9,369,086 B2
(45) Date of Patent: Jun. 14, 2016

(54) HIGH POWER SPIN TORQUE OSCILLATOR INTEGRATED ON A TRANSISTOR

(71) Applicant: Korea Advanced Institute of Science and Technology, Yuseong-gu, Daejeon (KR)

(72) Inventors: Min Cheol Shin, Daejeon (KR); Doo Hyung Kang, Daejeon (KR); Jae Hyun Lee, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 0 days.

(21) Appl. No.: 14/554,656

(22) Filed: Nov. 26, 2014

(65) Prior Publication Data

US 2016/0013754 A1    Jan. 14, 2016

(30) Foreign Application Priority Data

Jul. 9, 2014   (KR) ........................ 10-2014-0086057

(51) Int. Cl.
*H03B 15/00*    (2006.01)
*H03L 7/26*     (2006.01)
(Continued)

(52) U.S. Cl.
CPC .............. *H03B 15/006* (2013.01); *H01L 27/22* (2013.01); *H01L 29/66234* (2013.01); *H01L 29/66568* (2013.01); *H01L 43/02* (2013.01); *H01L 43/08* (2013.01); *H01L 43/12* (2013.01); *H03L 7/26* (2013.01)

(58) Field of Classification Search
CPC ........ B82Y 25/00; H01L 27/22; H01L 27/24; H01L 27/2436; H01L 27/2445; H01L 27/2454; H01L 43/00; H01L 43/02; H01L 43/08; H01L 43/12; H03B 15/00; H03B 15/003; H03B 15/006; H03L 7/26
USPC ................................ 331/3, 94.1, 96
See application file for complete search history.

(56) References Cited

U.S. PATENT DOCUMENTS 8,553,358 B2    10/2013  Mizushima et al.
2004/0257894 A1*  12/2004  Onogi .................. B82Y 10/00
                                              365/202

(Continued)

FOREIGN PATENT DOCUMENTS

JP    2012-212478     11/2012
KR   10-2012-0015943   2/2012

OTHER PUBLICATIONS

Deac et al., "Bias-driven high-power microwave emission from MgO-based tunnel magnetoresistance devices," Nature Physics. 4: 803-809 (2008).

(Continued)

*Primary Examiner* — Levi Gannon
(74) *Attorney, Agent, or Firm* — Greenberg Traurig, LLP; Chinh H. Pham

(57) ABSTRACT

Example embodiments are related to a high power spin torque oscillator that is integrated by combining a transistor. The high power spin torque oscillator according to example embodiments may include a spin torque oscillator and a transistor. The spin torque oscillator may perform an oscillation function and a transistor may perform an amplification function by integrating the spin torque oscillator and a transistor in one chip. The transistor may amplify an amplification signal of the spin torque oscillator. The high power spin torque oscillator may be integrated on FET or BJT.

15 Claims, 9 Drawing Sheets

(51) Int. Cl.
  *H01L 43/02* (2006.01)
  *H01L 27/22* (2006.01)
  *H01L 43/08* (2006.01)
  *H01L 43/12* (2006.01)
  *H01L 29/66* (2006.01)

(56) References Cited

U.S. PATENT DOCUMENTS

| | | | |
|---|---|---|---|
| 2005/0219771 A1 | 10/2005 | Sato et al. | |
| 2006/0060901 A1* | 3/2006 | Nakamura | G11C 11/16 257/295 |
| 2007/0109147 A1* | 5/2007 | Fukuzawa | B82Y 25/00 340/903 |
| 2008/0094886 A1* | 4/2008 | Ranjan | B82Y 10/00 365/171 |
| 2010/0308923 A1* | 12/2010 | Kaka | H03B 15/006 331/46 |
| 2012/0038428 A1 | 2/2012 | Lee et al. | |
| 2012/0104522 A1* | 5/2012 | Jung | H01F 10/3254 257/421 |
| 2012/0112796 A1* | 5/2012 | Choi | H03B 15/006 327/100 |
| 2014/0198564 A1* | 7/2014 | Guo | G11C 11/161 365/158 |

OTHER PUBLICATIONS

Deac, et al., "Bias-driven high-power microwave emission from MgO-based tunnel magnetoresistance devices", Nature Physics, vol. 4, pp. 803-809, Oct. 2008.

* cited by examiner

HIGH POWER SPIN TORQUE OSCILLATOR INTEGRATED ON A TRANSISTOR

CROSS-REFERENCE TO RELATED APPLICATION

This application claims priority under 35 USC §119 to Korean Patent Application No. 10-2014-0086057, filed on Jul. 9, 2014, in the Korean Intellectual Property Office (KIPO), the contents of which are herein incorporated by reference in their entirety.

BACKGROUND

1. Technical Field

Example embodiments relate generally to a high power spin torque oscillator (spin oscillator) integrated by combining a transistor and more particularly to a high power spin torque oscillator capable of decreasing noise and amplifying a output of the spin torque oscillator by integrating the spin torque oscillator on a gate of field effect transistor (FET) or a base of bipolar junction transistor (BJT).

2. Description of the Related Art

Because a unit element can be manufactured in nano-scale, a spin torque oscillator may be implemented as an array. A frequency conversion operation is possible by a wide band oscillation signal characteristic. Because a stable time of the operation is short, the spin torque oscillator may be applied to a high speed communication system.

However, because a output level of the spin torque oscillator that is presented until now is less than −40 dBm and a characteristic of a phase noise is bad, it was impossible that the spin torque oscillator replaces a voltage controlled oscillator and the spin torque oscillator is applied to a wireless communication element. In other words, a local oscillator of the wireless communication with −40 dB output level can not be used. Because the bad phase noise characteristic decreases signal to noise ratio (SNR), the spin torque oscillator with the present level may not replace the voltage controlled oscillator of a mobile communication.

Various researches are in progress to improve the phase noise characteristic and the output level. Most of the researches are focused on a oscillation function of the spin torque oscillator and applying the spin torque oscillator to a carrier oscillator.

A prior art that amplifies the output of the spin torque oscillator has problems such that noise by a matching network is increased because a amplifier is connected in a hybrid type and the power consumption is increased because of limitation of an amplification efficiency as described in a patent document 1.

PRIOR ART REFERENCE

Patent Reference

1. Korean Patent Publication No 10-2012-0015943

SUMMARY

A high power spin torque oscillator according to example embodiments may have a function such that a spin torque oscillator performs an oscillation function and a transistor performs an amplification function by integrating the spin torque oscillator and a transistor in one chip. The transistor may amplify an amplification signal of the spin torque oscillator.

In an example embodiment, the spin torque oscillator may be a tunneling magnetoresistance (TMR) structure or a giant magnetoresistance (GMR) structure formed by stacking a free magnetic layer, a nonmagnetic layer and a fixed magnetic layer. The free magnetic layer may include a magnetic domain wall or a magnetic vortex and may be manufactured with a pillar structure or a point contact structure.

In an example embodiment, the transistor may be a FET or a BJT.

In an example embodiment, a voltage source or a current source may be applied to the spin torque oscillator.

In an example embodiment, in case the transistor is a MOSFET and a voltage source is applied to the spin torque oscillator, a gate voltage is generated by bypassing a spin current using a bypass resistor.

In an example embodiment, in a method of manufacturing a high power spin torque oscillator, a MOSFET structure is formed by forming a source, a drain and a gate on a silicon substrate. A spin torque oscillator is formed by stacking a free magnetic layer, a nonmagnetic layer and a fixed magnetic layer between an insulator of the gate and a gate electrode. The spin torque oscillator having an oscillation function is integrated on a transistor having an amplification function.

In an example embodiment, in case a voltage source is applied to the spin torque oscillator, a spin current may be bypassed by forming a bypass resistor between the free magnetic layer or the fixed magnetic layer on the insulator of the gate and a ground voltage so that a gate voltage is generated.

In an example embodiment, the spin torque oscillator may transfer a tunnel current by controlling a width of the insulator of the gate. a electrode pad may be connected to the free magnetic layer or the fixed magnetic layer on the insulator of the gate. A spin current may be added to a channel current without using a bypass resistor or a common gate.

In an example embodiment, in a method of manufacturing a high power spin torque oscillator, a BJT structure is formed by forming a emitter, a base and a collector on a silicon substrate. A spin torque oscillator is formed by stacking a free magnetic layer, a nonmagnetic layer and a fixed magnetic layer between the base and a base electrode. The spin torque oscillator having an oscillation function is integrated on a transistor having an amplification function.

In an example embodiment, in a method of manufacturing a high power spin torque oscillator, a BJT structure is formed by forming a emitter, a base and a collector on a silicon substrate through a deposition of a magnetic semiconductor. A spin torque oscillator is formed by stacking a nonmagnetic layer and a fixed magnetic layer between the base and a base electrode. The spin torque oscillator having an oscillation function is integrated on a transistor having an amplification function.

The high power spin torque oscillator according to example embodiments may improve a low output and a high noise characteristic that were problems of prior art by integrating the oscillator having the oscillation function and the amplifier having the amplification function in one element.

In addition, the high power spin torque oscillator may be integrated in a substrate with small size.

In addition, the high power spin torque oscillator may be applied to an amplitude modulation, a frequency modulation or a phase modulation communication modem because the output range is controlled.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
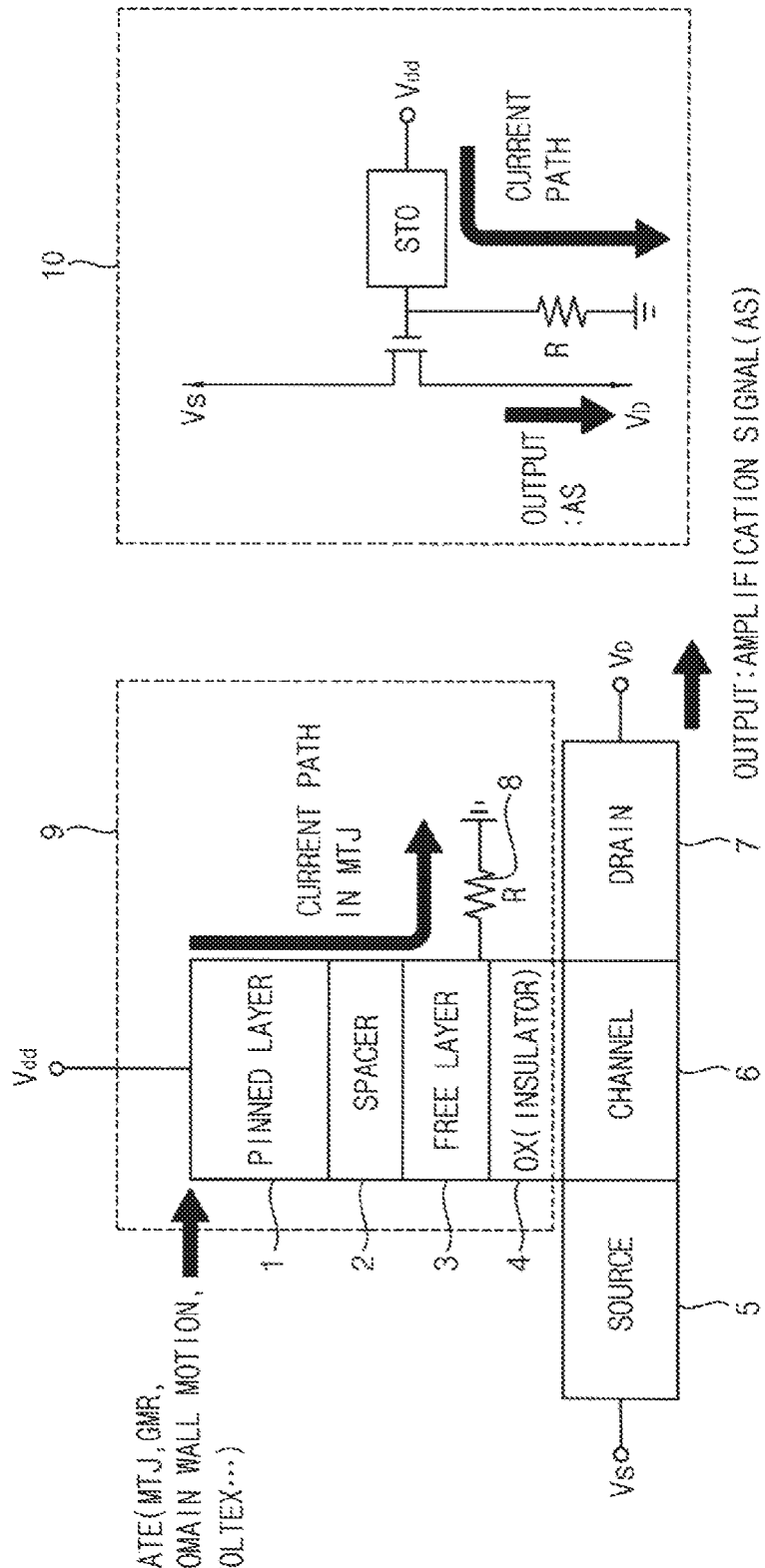
FIG. 1 is a cross-sectional diagram illustrating a spin torque oscillator according to example embodiments that is combined with MOSFET using a voltage source.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A high power spin torque oscillator according to example embodiments may include a spin torque oscillator and a transistor that are integrated in one chip. The high power spin torque oscillator that performs an oscillation function and an amplification function may be implemented in a monolithic integrated circuit by applying CMOS process.

A spin torque oscillator may be formed by stacking a free magnetic layer, a nonmagnetic layer and a fixed magnetic layer. The spin torque oscillator may output a oscillation signal according to precession of a magnetization direction of the free magnetic layer by applying current or magnetic field and using a spin transfer torque.

In case the nonmagnetic layer is implemented with an insulator layer, a tunneling magnetoresistance (TMR) structure using a tunneling phenomenon may be formed. In case the nonmagnetic layer is implemented with a conduction layer, a giant magnetoresistance (GMR) structure using a giant magnetoresistance phenomenon may be formed. The free magnetic layer may include a magnetic domain wall or a magnetic vortex and may be formed with a pillar structure or a point contact structure according to a manufacturing method.

The transistor may not be limited to MOSFET, BJT, JFET or MESFET. The transistor may be a amplifier that can be integrated with the spin torque oscillator.

FIG. 1 is a cross-sectional diagram illustrating a spin torque oscillator according to example embodiments that is combined with MOSFET using a voltage source. The high power spin torque oscillator may perform an oscillation function and an amplification function by integrating the spin torque oscillator on the gate electrode of the MOSFET. The oscillation signal may be inputted through the gate of the MOSFET. The oscillation signal may be amplified through the MOSFET.

In an manufacturing method, first of all, a MOSFET structure is formed by forming a source, a drain and a gate on a silicon substrate. A spin torque oscillator may be formed on the gate electrode. The spin torque oscillator is formed by stacking a free magnetic layer, a nonmagnetic layer and a fixed magnetic layer between an insulator of the gate and a gate electrode.

The gate voltage that drives MOSFET may use a voltage drop by a spin current. In other words, if a current source or a voltage source is applied to the spin torque oscillator, the spin current may be generated. the voltage drop by the spin current may be used as the operation gate voltage.

In FIG. 1, in case a voltage source is applied, a bypass resistor may be used for the spin current. The bypass resistor R may be connected between the free magnetic layer or the fixed magnetic layer on the insulator of the gate and a ground voltage. A threshold voltage of MOSFET may be 0.4V. In case the size of the spin torque oscillator 70*160 nm^2, because the oscillation of the spin torque oscillator is in range of several mA, the average resistor $R_{STO}$ of the spin torque oscillator is 75 ohm and the gate voltage is 0.8~0.85V in case of connecting the bypass resistor R of 50 ohm to the ground voltage, the amplification is possible.

Figure 2:
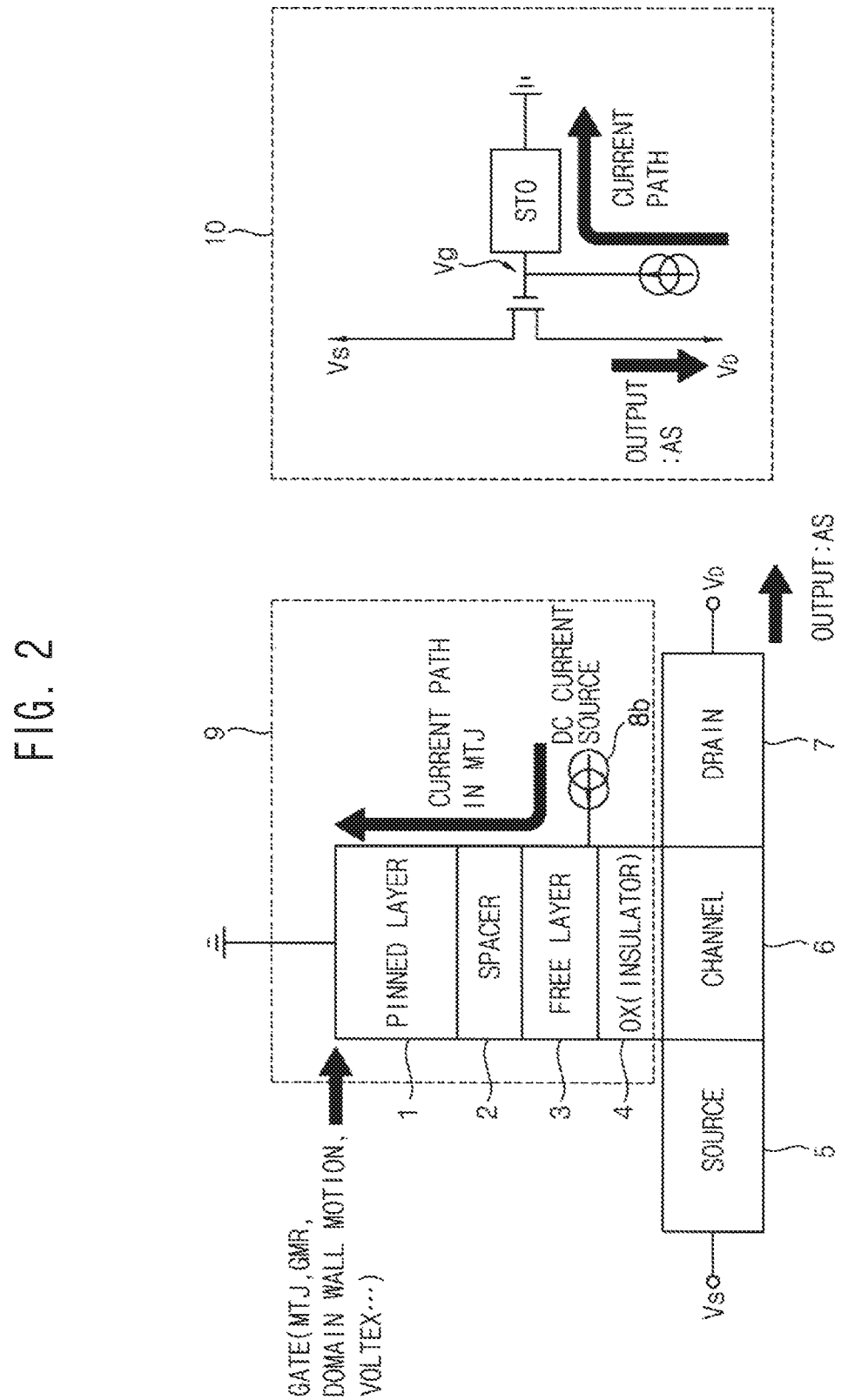
FIG. 2 is a cross-sectional diagram illustrating a spin torque oscillator according to example embodiments that is combined with MOSFET using a current source.

FIG. 2 is a cross-sectional diagram illustrating a spin torque oscillator according to example embodiments that is combined with MOSFET using a current source.

FIG. 2 is a case where the current source is applied to the spin torque oscillator. In this case, one end of the spin torque oscillator may be connected to the ground voltage. the voltage drop of the spin torque oscillator resistor $R_{STO}$ may be applied as the gate voltage by applying the current source to the fixed magnetic layer or the free magnetic layer.

Figure 3:
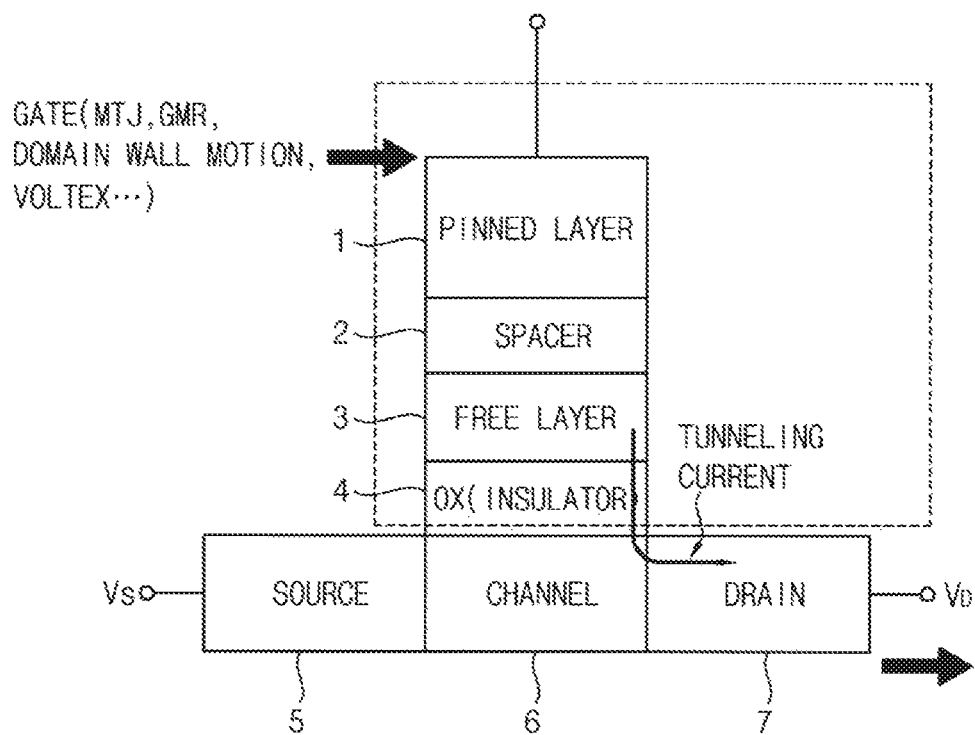
FIG. 3 is a cross-sectional diagram illustrating a spin torque oscillator according to example embodiments using a tunneling oxide insulator.

FIG. 3 is a cross-sectional diagram illustrating a spin torque oscillator according to example embodiments that uses a tunneling oxide insulator. In the spin torque oscillator, the bypass resistor R or the common gate may not be used. The spin current may be added to the channel current by controlling the width of the insulator layer of the gate.

Figure 4:
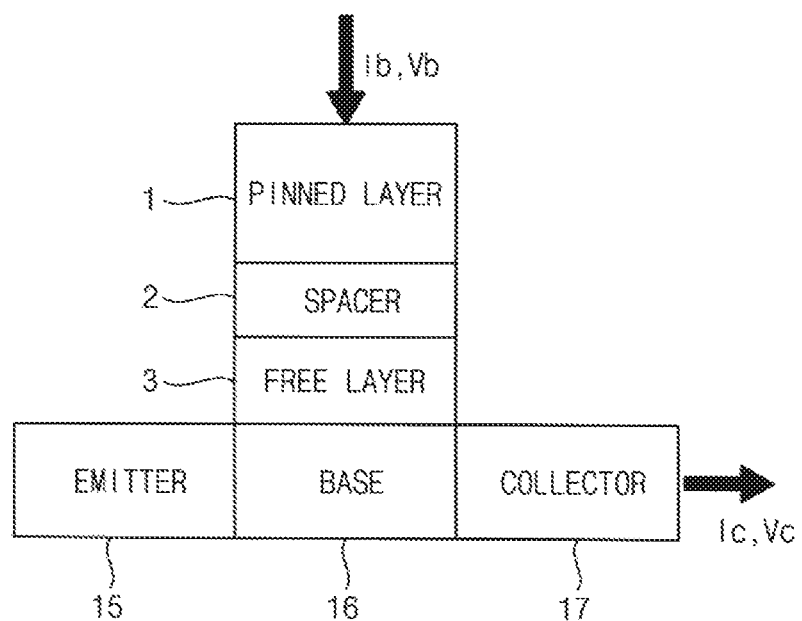
FIG. 4 is a cross-sectional diagram illustrating a spin torque oscillator according to an example embodiment that is combined with BJT.

FIG. 4 is a cross-sectional diagram illustrating a spin torque oscillator according to an example embodiment that is combined with BJT. The high power spin torque oscillator may perform an oscillation function and an amplification function by integrating the spin torque oscillator on the base of BJT. The oscillation signal may be inputted through the base of the BJT. The oscillation signal may be amplified through the BJT.

In an manufacturing method, first of all, a BJT structure is formed by forming a emitter, a base and a collector on a silicon substrate. A spin torque oscillator may be formed on the base. The spin torque oscillator is formed by stacking a free magnetic layer, a nonmagnetic layer and a fixed magnetic layer on the base.

Figure 5:
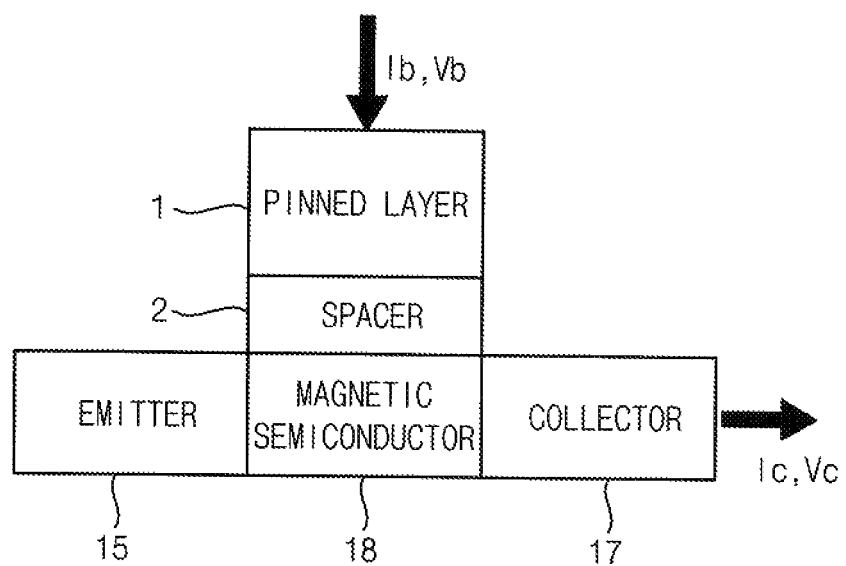
FIG. 5 is a cross-sectional diagram illustrating a spin torque oscillator according to another example embodiment that is combined with BJT.

FIG. 5 is a cross-sectional diagram illustrating a spin torque oscillator according to another example embodiment that is combined with BJT. The base layer may be formed using a magnetic semiconductor. The magnetic semiconductor may be a semiconductor that has a magnetic characteristic by controlling the electron and the spin. The magnetic semiconductor may be ZnMnO, GaMnAs, EuX(X: O, S), $CaCr_2X_4$(X: S, Se), Li(Zn,Mn)As, $MnGeP_2$ or $MnGeAs_2$ In manufacturing method, a BJT structure is formed by forming an emitter, a base and a collector on a silicon substrate through a deposition of a magnetic semiconductor. In this case, the base may be a fixed magnetic layer or a free magnetic layer. A spin torque oscillator is formed by stacking a nonmagnetic layer and a fixed magnetic layer or the free magnetic layer between the base and a base electrode. In other words, because the base that is the magnetic layer may be an output of the oscillator and may be an input of the amplifier, the oscillation signal may be amplified.

The various amplifier transistor using the magnetic semiconductor may be implemented with BJT, MOSFET and MESFET.

Figure 6:
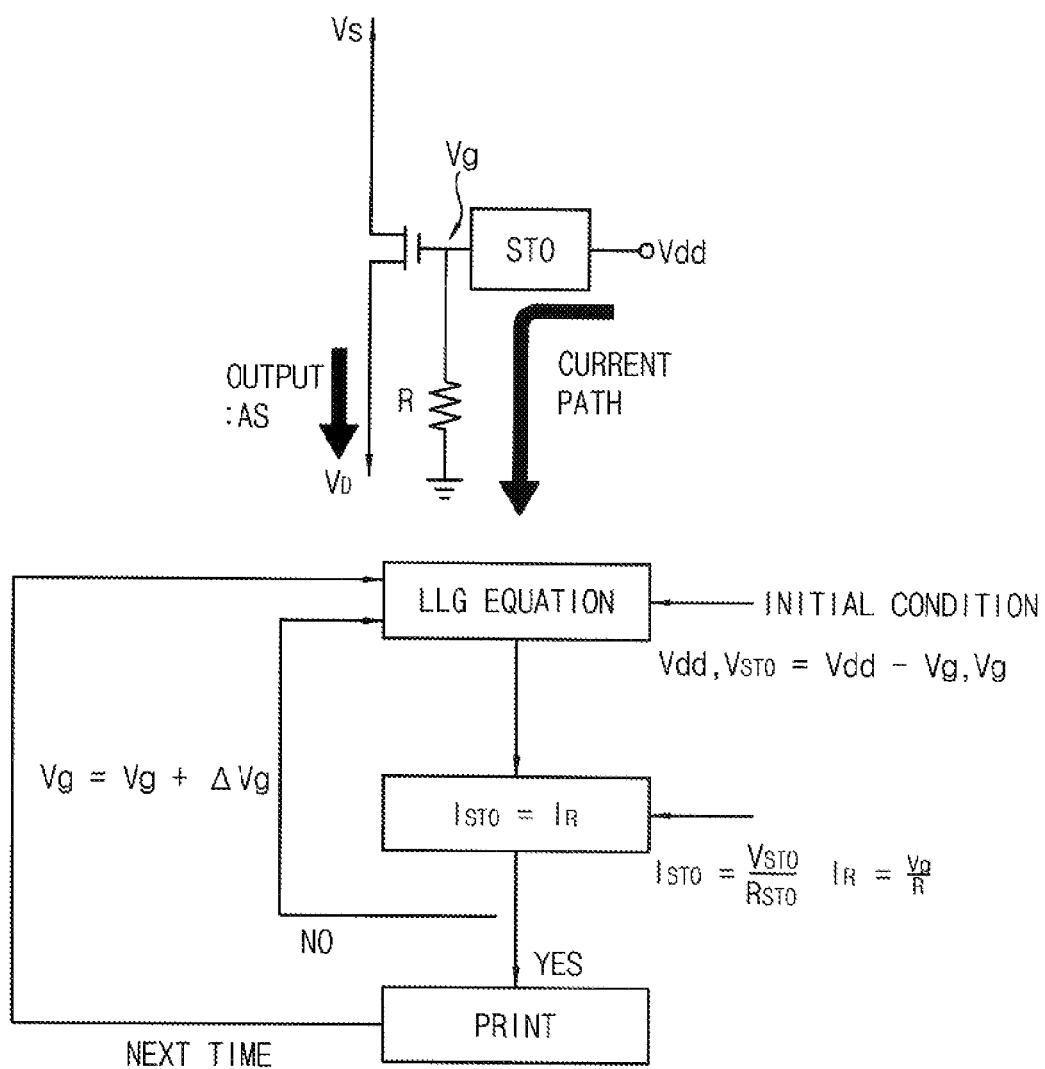
FIG. 6 is a diagram for describing a calculation of a gate voltage of a spin torque oscillator according to an example embodiment that is combined with MOSFET using a voltage source.

FIG. 6 is a diagram for describing a calculation of a gate voltage $V_g$ of a spin torque oscillator according to an example embodiment that is combined with MOSFET using a voltage source.

In this example, the bypass resistor R may be used. In this case, the voltage that is applied to the spin torque oscillator may be $V_{STO}$. The gate voltage may be $V_g$. $V_{STO}$ and $V_g$ may be illustrated as a math equation 1.

$$V_{STO}=V_{dd}V_g=I_{STO}R_{STO}$$

$$V_g=I_R R \quad \text{[math equation 1]}$$

The calculation of the magnetization of the spin torque oscillator may be calculated using a modified Landau-Lifshitz-Gilbert equation (LLG). $V_g$ may be calculated using a condition where $I_{STO}=I_R$ is satisfied and a calculation loop of FIG. 6.

Figure 7:
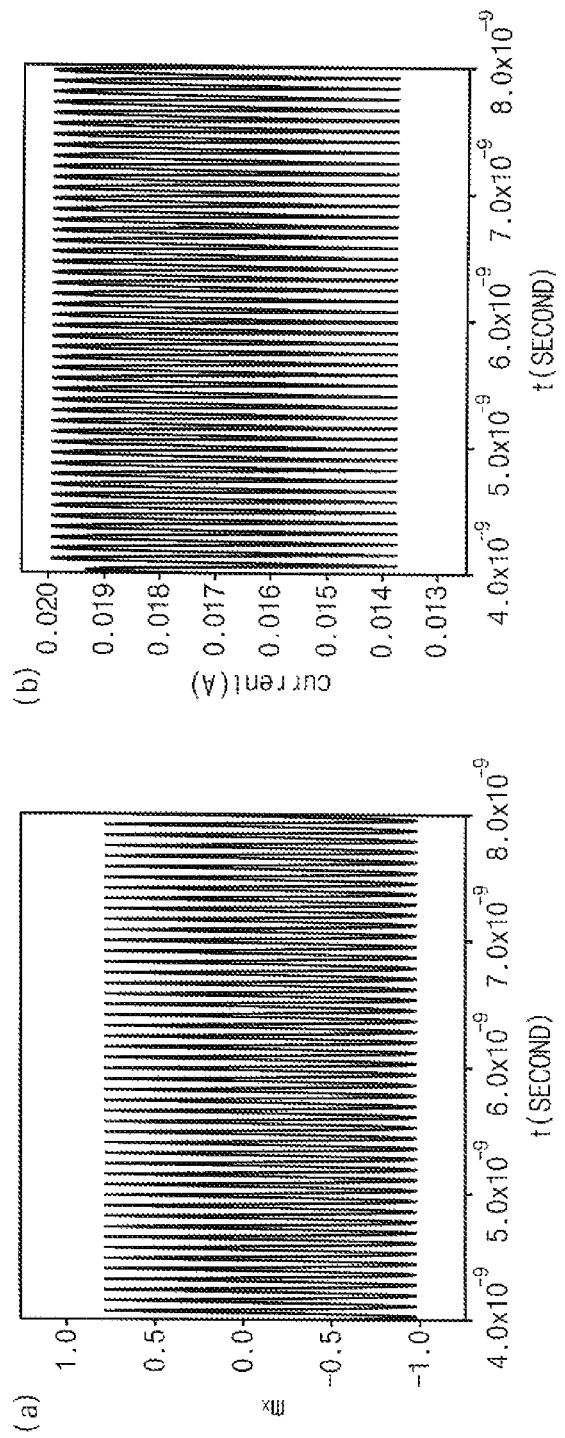
FIG. 7 is a diagram for describing a result of a spin current and magnetization.

FIG. 7 is a diagram for describing a result of a spin current and magnetization in case $V_{dd}=2$ V, R=50, $R_{STO,ave}=75$ is satisfied. FIG. 7(a) is illustrating the magnetization value by the spin as time is changed. FIG. 7(b) is the spin current as time is changed. In other words, in case the voltage source of 2 V and the bypass resistor R of 50 ohm are used, the spin torque oscillator may be oscillated.

Figure 8:
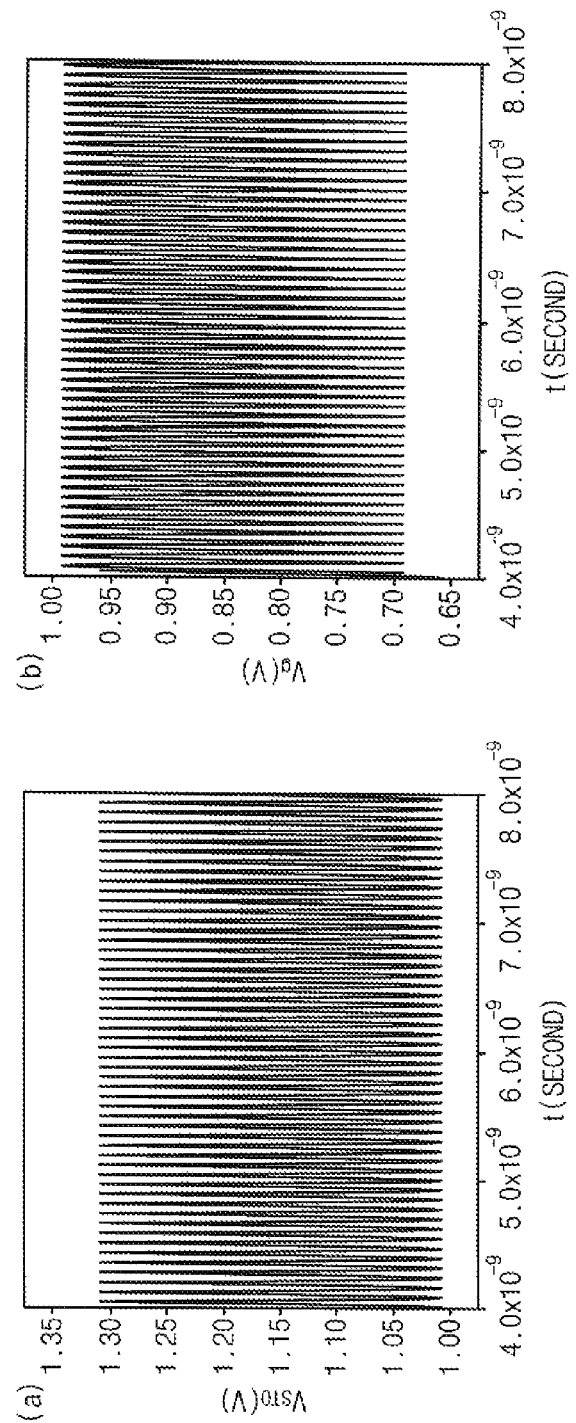
FIG. 8 is a diagram for describing a gate voltage and a spin torque oscillator resistor.

FIG. 8 is a diagram for describing a gate voltage and a spin torque oscillator resistor. The voltage drop $V_{STO}$ by self resistor of the spin torque oscillator and the gate voltage $V_g$ by the bypass resistor R may be calculated in the condition of FIG. 7. Because the gate voltage of 0.8~0.85 V may be applied to MOSFET of which threshold voltage is 0.4 V. The amplification may be performed by driving the gate of MOSFET.

Figure 9:
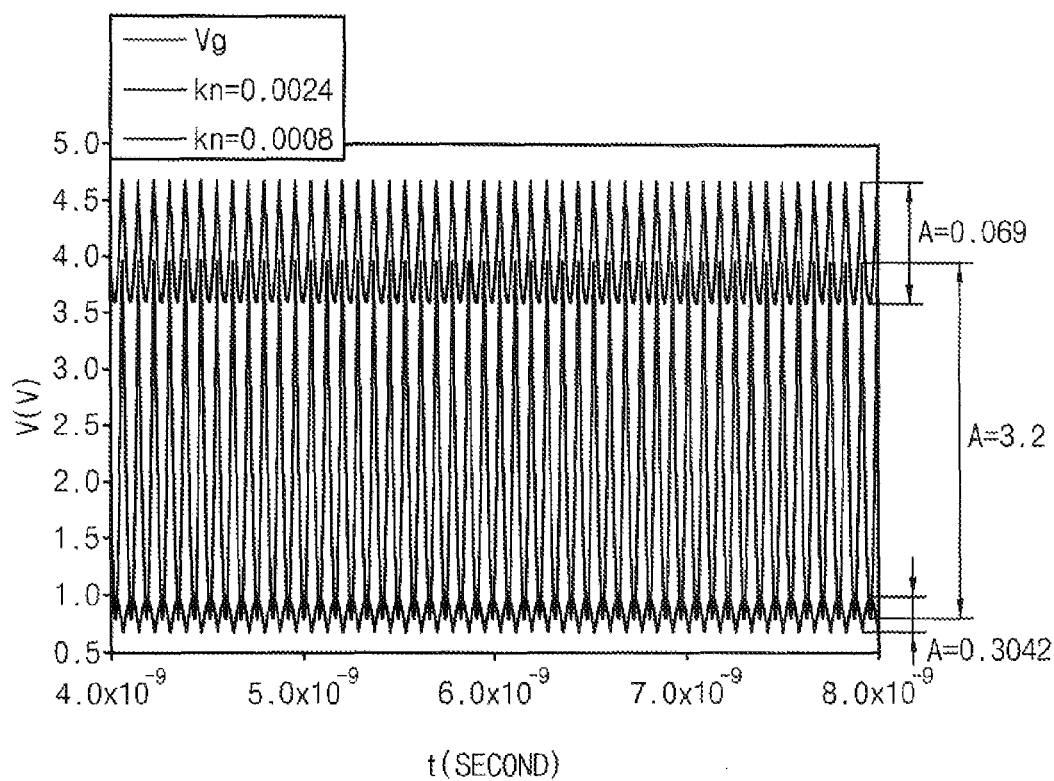
FIG. 9 is a diagram for describing an output voltage gain of a spin torque oscillator according to example embodiments.

FIG. 9 is a diagram for describing an output voltage gain of a spin torque oscillator according to example embodiments. In this case, the voltage source of 2 V $V_{dd}$ may be applied to the spin torque oscillator. The bypass resistor R may be 50 ohm.

In this case a output voltage $V_o$ of the drain of MOSFET may be calculated using a math equation 2.

$$V_o=V_{ds}\tfrac{1}{2}R_D k_n(V_g V_t) \quad \text{[math equation 2]}$$

In this case, $R_D$ may be 10 ohm as the output resistor of MOSFET. $k_n$ may be a characteristic value of the element. The threshold voltage $V_t$ may be 0.4 V. The bias voltage $V_{ds}$ may be 5V.

In case $k_n$ is 0.0008, the calculated voltage gain may be 3.5. In case $k_n$ is 0.0024, the calculated voltage gain may be 10. The higher voltage gain may be obtained by optimizing MOSFET element and the output of the spin torque oscillator may be amplified.

Figure 10:
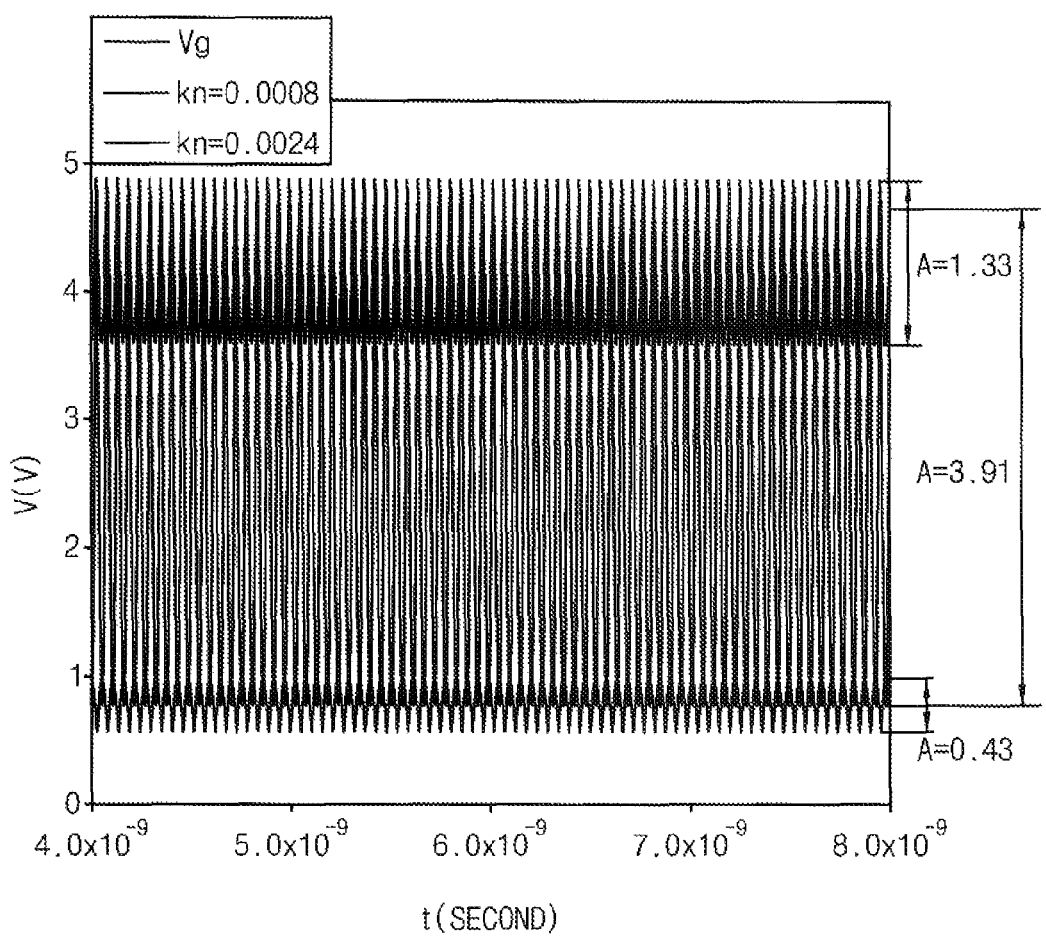
FIG. 10 is a diagram for describing an output voltage gain of a spin torque oscillator according to example embodiment that is combined with MOSFET using a current source.

FIG. 10 is a diagram for describing an output voltage gain of a spin torque oscillator according to example embodiment that is combined with MOSFET using a current source.

The current source may be the current source of FIG. 2. The calculation condition may be equal to the math equation 2. the current $I_{dc}$ of the current source may be 10 mA. The drain bias $V_{ds}$ may be 5 V.

In case $k_n$ is 0.0008, the calculated voltage gain may be 3.09. In case $k_n$ is 0.0024, the calculated voltage gain may be 9.09. The higher voltage gain may be obtained by optimizing MOSFET element and the output of the spin torque oscillator may be amplified.

A high power spin torque oscillator according to example embodiments may include a spin torque oscillator and a transistor that are integrated in one chip. The high power spin torque oscillator that performs an oscillation function and an amplification function may be implemented in a monolithic integrated circuit by applying CMOS process.

In addition, the high power spin torque oscillator may implement a high output by combining outputs of the array on the substrate.

EXPLANATION OF REFERENCE MARKS

| | |
|---|---|
| 1: fixed magnetic layer | 2: nonmagnetic layer |
| 3: free magnetic layer | 4: insulator |
| 5: source | 6: channel |
| 7: drain | 8: bypass resistor   8b: DC current source |
| 9: spin torque oscillator | 10, 11: equivalent circuit diagram |
| 12: current source | 15: emitter |
| 16: base | 17: collector |
| 18: magnetic semiconductor | |

What is claimed is:

1. A method of manufacturing a high power spin torque oscillator comprising:
    forming a MOSFET structure by forming a source, a drain and a gate on a silicon substrate; and
    forming a spin torque oscillator by stacking a free magnetic layer, a nonmagnetic layer and a fixed magnetic layer between an insulator of the gate and a gate electrode,
    wherein the spin torque oscillator having an oscillation function is integrated on a transistor having an amplification function.

2. The method of claim 1,
    wherein, in case a voltage source is applied to the spin torque oscillator, a spin current is bypassed by forming a bypass resistor between the free magnetic layer or the fixed magnetic layer on the insulator of the gate and a ground voltage so that a gate voltage is generated.

3. The method of claim 1,
    wherein, in case a current source is applied to the spin torque oscillator, an electrode pad is connected to the free magnetic layer or the fixed magnetic layer on the insulator of the gate and one end of the spin torque oscillator is connected to a ground voltage so that a gate voltage is generated by a self-resistor of the spin torque oscillator.

4. A method of manufacturing a high power spin torque oscillator comprising:
    forming a BJT structure by forming a emitter, a base and a collector on a silicon substrate; and
    forming a spin torque oscillator by stacking a free magnetic layer, a nonmagnetic layer and a fixed magnetic layer between the base and a base electrode,
    wherein the spin torque oscillator having an oscillation function is integrated on a transistor having an amplification function.

5. A method of manufacturing a high power spin torque oscillator comprising:
    forming a BJT structure by forming a emitter, a base and a collector on a silicon substrate through a deposition of a magnetic semiconductor; and
    forming a spin torque oscillator by stacking a nonmagnetic layer and a fixed magnetic layer between the base and a base electrode,
    wherein the spin torque oscillator having an oscillation function is integrated on a transistor having an amplification function.

6. The method of claim 5,
    wherein the spin torque oscillator is formed with a pillar structure or a point contact structure.

7. A high power spin torque oscillator comprising:
    a spin torque oscillator; and
    a transistor,
    wherein the spin torque oscillator and the transistor are integrated in the high power spin torque oscillator in a form of one chip, and
    wherein the transistor is a MOSFET having a gate voltage generated by bypassing a spin current using a bypass resistor.

8. The high power spin torque oscillator of claim 7,
    wherein the spin torque oscillator has an oscillation function, and
    wherein the transistor has a function of amplifying an oscillation signal of the spin torque oscillator.

9. The high power spin torque oscillator of claim 7,
    wherein the spin torque oscillator is formed by stacking a free magnetic layer, a nonmagnetic layer and a fixed magnetic layer.

10. The high power spin torque oscillator of claim 7,
    wherein a structure of the spin torque oscillator is a tunneling magnetoresistance (TMR) structure.

11. The high power spin torque oscillator of claim 7,
    wherein a structure of the spin torque oscillator is a giant magnetoresistance (GMR) structure.

12. The high power spin torque oscillator of claim 7,
    wherein the spin torque oscillator is a magnetic domain wall type.

13. The high power spin torque oscillator of claim 7,
    wherein the spin torque oscillator is a magnetic vortex type.

14. The high power spin torque oscillator of claim 7,
    wherein a voltage source is applied to the spin torque oscillator.

15. The high power spin torque oscillator of claim 7,
    wherein a current source is applied to the spin torque oscillator.

* * * * *